United States Patent
Tsuji

(10) Patent No.: US 10,916,917 B2
(45) Date of Patent: Feb. 9, 2021

(54) METHOD OF MANUFACTURING SURFACE EMITTING LASER

(71) Applicant: SUMITOMO ELECTRIC INDUSTRIES, LTD., Osaka (JP)

(72) Inventor: Yukihiro Tsuji, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/577,408

(22) Filed: Sep. 20, 2019

(65) Prior Publication Data

US 2020/0136352 A1 Apr. 30, 2020

(30) Foreign Application Priority Data

Oct. 25, 2018 (JP) ................... 2018-200662

(51) Int. Cl.
*H01S 5/02* (2006.01)
*H01S 5/183* (2006.01)
*H01S 5/343* (2006.01)
*H01S 5/042* (2006.01)

(52) U.S. Cl.
CPC ........ *H01S 5/18361* (2013.01); *H01S 5/0206* (2013.01); *H01S 5/04252* (2019.08); *H01S 5/18313* (2013.01); *H01S 5/18347* (2013.01); *H01S 5/34313* (2013.01)

(58) Field of Classification Search
CPC ........... H01S 5/18311; H01S 2301/176; H01L 33/647
See application file for complete search history.

(56) References Cited

U.S. PATENT DOCUMENTS

| | | | | |
|---|---|---|---|---|
| 2009/0116526 A1* | 5/2009 | Hashimoto | ......... | H01S 5/18369 372/46.01 |
| 2009/0168825 A1* | 7/2009 | Koda | ................. | H01S 5/18311 372/45.01 |
| 2010/0202482 A1* | 8/2010 | Masui | ................. | H01S 5/02276 372/43.01 |
| 2010/0226402 A1* | 9/2010 | Maeda | ................ | H01S 5/04256 372/45.01 |
| 2011/0007769 A1* | 1/2011 | Masui | ................. | H01S 5/18316 372/46.013 |
| 2011/0064109 A1* | 3/2011 | Masui | ................. | H01S 5/18311 372/46.013 |

FOREIGN PATENT DOCUMENTS

WO 2015-033649 3/2015

* cited by examiner

*Primary Examiner* — Jaehwan Oh
(74) *Attorney, Agent, or Firm* — Smith, Gambrell & Russell, LLP.

(57) ABSTRACT

A method of manufacturing a surface emitting laser includes: forming a mesa by performing etching on a lower reflector layer, an active layer, and an upper reflector layer; forming a current narrowing layer by oxidizing a part of the upper reflector layer; exposing a substrate by performing etching on the lower reflector layer, the active layer, and the upper reflector layer, using a chlorine-containing gas; cleaning the substrate; performing heat treatment on the substrate; forming an insulating film covering a surface of the substrate; forming an electrode on the lower reflector layer and the upper reflector layer; and performing heat treatment on the substrate, wherein a temperature in the first heat treatment is lower than a temperature in the forming the current narrowing layer.

4 Claims, 7 Drawing Sheets

METHOD OF MANUFACTURING SURFACE EMITTING LASER

CROSS-REFERENCE TO RELATED APPLICATION

This application is based upon and claims the benefit of priority of the prior Japanese Patent Application No. 2018-200662, filed on Oct. 25, 2018, the entire contents of which are incorporated herein by reference.

BACKGROUND

(i) Technical Field

The present invention relates to a method of manufacturing a surface emitting laser.

(ii) Related Art

International Publication No. 2015/033649 discloses a vertical cavity surface emitting laser (VCSEL). In some VCSELs, ions are injected into a semiconductor layer, to form a high-resistance region to reduce parasitic capacitance.

SUMMARY

To separate surface emitting laser elements formed in a wafer from one another, etching is performed on a semiconductor layer, and an insulating film is then formed. However, there are cases where the insulating film peels off the surface subjected to the etching. To counter this, an embodiment of the present invention aims to provide a surface emitting laser manufacturing method that is capable of preventing peeling of the insulating film.

According to an aspect of the present invention, there is provided a method of manufacturing a surface emitting laser, the method including: a step of preparing a substrate containing gallium and arsenic, a lower reflector layer, an active layer, and an upper reflector layer being formed sequentially in the substrate, the lower reflector layer including a semiconductor multilayer film, the upper reflector layer including a semiconductor multilayer film; a step of forming a mesa by performing etching on the lower reflector layer, the active layer, and the upper reflector layer; a step of forming a current narrowing layer by oxidizing a part of the upper reflector layer, after the step of forming the mesa; a step of exposing the substrate by performing etching on the lower reflector layer, the active layer, and the upper reflector layer, using a chlorine-containing gas; a step of cleaning the substrate, after the step of exposing the substrate; a first heat treatment step of performing heat treatment on the substrate, after the step of cleaning; a step of forming an insulating film covering a surface of the substrate exposed by the etching, after the first heat treatment step; a step of forming an electrode on the lower reflector layer and the upper reflector layer; and a second heat treatment step of performing heat treatment on the substrate after the formation of the electrode, wherein a temperature in the first heat treatment step is lower than a temperature in the step of forming the current narrowing layer.

DETAILED DESCRIPTION

Figure 1A:
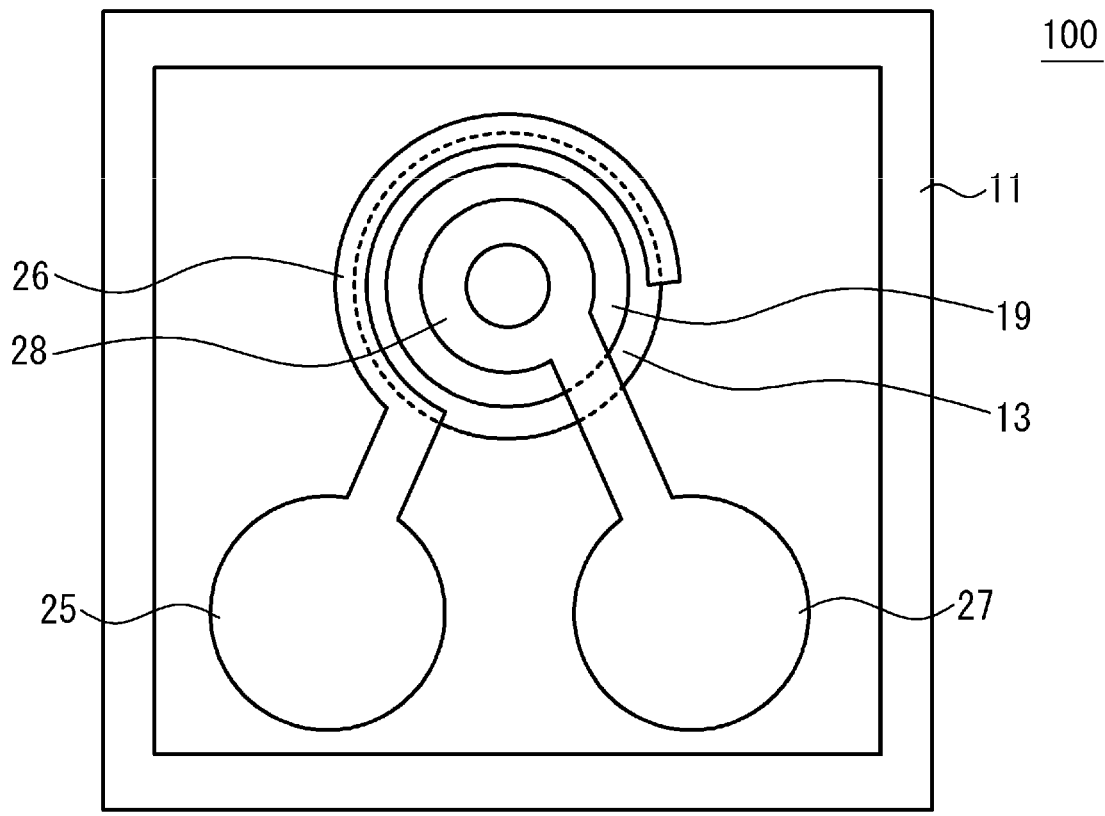
FIG. 1A is a plan view of an example of a surface emitting laser according to a first embodiment.

Description of Embodiments of the Present Invention

First, the subject matter of an embodiment of the present invention is described as listed below.

An embodiment of the present invention is (1) a method of manufacturing a surface emitting laser, the method including: a step of preparing a substrate containing gallium and arsenic, a lower reflector layer, an active layer, and an upper reflector layer being formed sequentially in the substrate, the lower reflector layer including a semiconductor multilayer film, the upper reflector layer including a semiconductor multilayer film; a step of forming a mesa by performing etching on the lower reflector layer, the active layer, and the upper reflector layer; a step of forming a current narrowing layer by oxidizing a part of the upper reflector layer, after the step of forming the mesa; a step of exposing the substrate by performing etching on the lower reflector layer, the active layer, and the upper reflector layer, using a chlorine-containing gas; a step of cleaning the substrate, after the step of exposing the substrate; a first heat treatment step of performing heat treatment on the substrate, after the step of cleaning; a step of forming an insulating film covering the surface of the substrate exposed by the etching, after the first heat treatment step; a step of forming an electrode on the lower reflector layer and the upper reflector layer; and a second heat treatment step of performing heat treatment on the substrate after the formation of the electrode. In this method, the temperature in the first heat treatment step is lower than the temperature in the step of forming the current narrowing layer. The chloride-containing gas is removed in the cleaning after the etching. In that stage, an arsenic oxide ($As_2O_3$) is generated on the surface of the substrate subjected to the etching. After the $As_2O_3$ is removed by the first heat treatment step, the formation of the insulating film and the second heat treatment step are carried out. As a result, it is possible to prevent peeling of the insulating film due to dissolution and sublimation of the $As_2O_3$.

(2) The temperature in the first heat treatment step may be not lower than 250 degrees C. and not higher than 350 degrees C. The $As_2O_3$ can be removed, and damage to the current narrowing layer can also be prevented.

(3) In the first heat treatment step, the substrate may be disposed in a reduced-pressure atmosphere. Because of this, the $As_2O_3$ can be more effectively removed.

(4) The first heat treatment step may be continued for not shorter than 30 minutes and not longer than one hour. Because of this, the $As_2O_3$ can be more effectively removed.

Details of Embodiments of the Present Invention

The following is a description of a specific example of a method of manufacturing a surface emitting laser according to an embodiment of the present invention, with reference to the drawings. It should be noted that the present invention is not limited to these examples but is shown by the claims, and it is intended that all modifications are included in the equivalents of the claims and the scope of the claims.

First Embodiment

Surface Emitting Laser

Figure 1B:
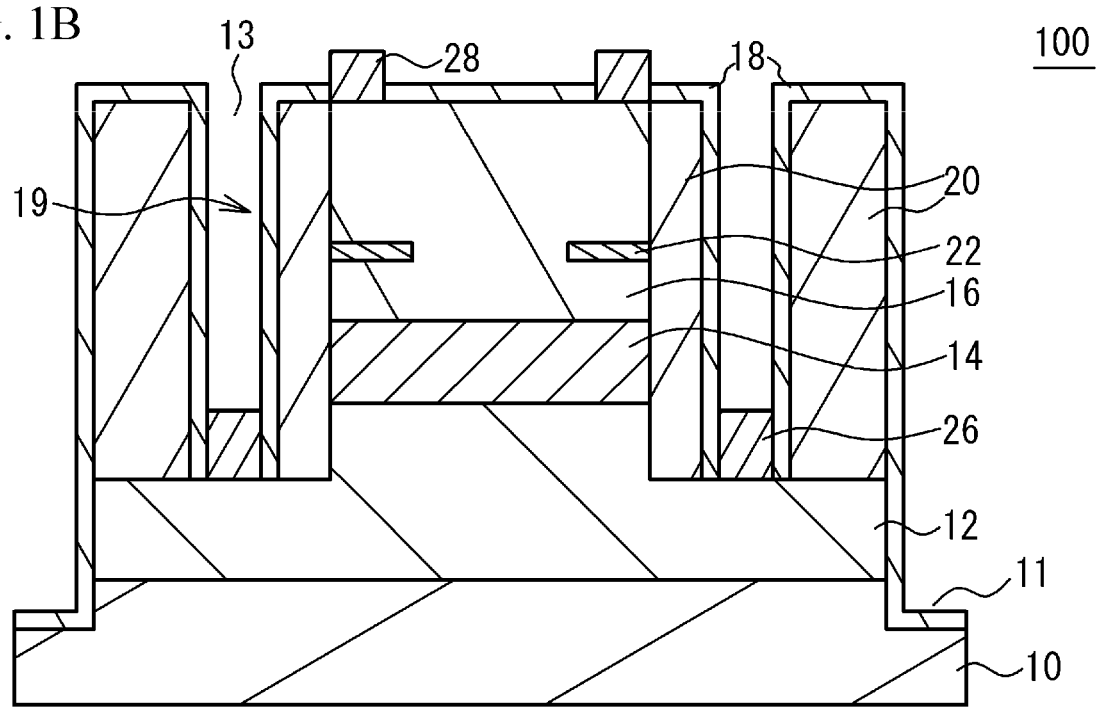
FIG. 1B is a cross-sectional view of the example of a surface emitting laser.

FIG. 1A is a plan view of an example of a surface emitting laser 100 according to a first embodiment. FIG. 1B is a cross-sectional view of the example of the surface emitting laser 100.

As shown in FIG. 1A, a groove 11 for element separation is formed in the outer periphery of the surface emitting laser 100. A mesa 19, and pads 25 and 27 are disposed in the portion surrounded by the groove 11. A groove 13 is formed around the mesa 19. An electrode 26 is disposed on the mesa 19, and an electrode 28 is disposed in the groove 13. The pad 25 is electrically connected to the electrode 26, and the pad 27 is electrically connected to the electrode 28.

As shown in FIG. 1B, the surface emitting laser 100 is a VCSEL that includes a substrate 10, a lower reflector (distributed Bragg reflector: DBR) layer 12, an active layer 14, an upper reflector layer 16, an insulating film 18, and the electrodes 26 and 28.

The substrate 10 is a semiconductor substrate formed with semi-insulating gallium arsenide (GaAs), for example. The lower reflector layer 12, the active layer 14, and the upper reflector layer 16 are stacked in this order on the substrate 10, and these semiconductor layers constitute the mesa 19.

The lower reflector layer 12 is a semiconductor multilayer film formed by alternately stacking n-type $Al_{0.16}Ga_{0.84}As$ films and n-type $Al_{0.9}Ga_{0.1}As$ films of $\lambda/4$ in optical thickness, and includes a contact layer formed with AlGaAs. Note that $\lambda$ is the wavelength of light. The lower reflector layer 12 is doped with silicon (Si), for example. Further, the lower reflector layer 12 includes a contact layer that is in contact with the electrode 26.

The active layer 14 is formed with AlGaAs and AlInGaAs, for example. The active layer 14 has a multiple quantum well (MQW) structure in which quantum well layers and barrier layers are alternately stacked, and has an optical gain. A cladding layer (not shown) is interposed between the active layer 14 and the lower reflector layer 12, and between the active layer 14 and the upper reflector layer 16.

The upper reflector layer 16 is a semiconductor multilayer film formed by alternately stacking p-type $Al_{0.16}Ga_{0.84}As$ films and $Al_{0.9}Ga_{0.1}As$ films of $\lambda/4$ in optical thickness, and includes a contact layer formed with AlGaAs. The upper reflector layer 16 is doped with carbon (C), for example. Further, the upper reflector layer 16 includes a contact layer that is in contact with the electrode 28.

The substrate 10, the lower reflector layer 12, the active layer 14, and the upper reflector layer 16 may be formed with compound semiconductors other than the above. For example, the substrate 10 may be formed with $Al_xGa_{1-x}As$ ($0 \leq x \leq 0.2$) or the like, instead of GaAs, and contains Ga and As.

Part of the upper reflector layer 16 is selectively oxidized, to form a current narrowing layer 22. The current narrowing layer 22 is formed in the edge of the upper reflector layer 16, and is not formed in the central portion of the upper reflector layer 16. The current narrowing layer 22 contains aluminum oxide ($Al_2O_3$), for example, and have insulating properties.

It is more difficult for current to flow in the current narrowing layer 22 than in an unoxidized portion. Therefore, the unoxidized portion that is the central portion of the upper reflector layer 16 serves as a current path, to allow efficient current injection.

A high-resistance region 20 is formed on the outer side of the current narrowing layer 22 and in the periphery of the mesa 19. The high-resistance region 20 exists in the upper reflector layer 16, the active layer 14, and an upper portion of the lower reflector layer 12, and is formed by ion injection as described later. The groove 13 penetrates through the high-resistance region 20 in the thickness direction, to reach the lower reflector layer 12 and surround the mesa 19. The groove 11 is located on the outer side of the groove 13 and the high-resistance region 20, surrounds the groove 13 and the high-resistance region 20, and reaches the substrate 10 in the thickness direction.

The insulating film 18 is a silicon nitride (SiN) film of 40 nm in thickness, for example, and covers the bottom surface of the groove 11, the surfaces of the high-resistance region 20, and the surfaces of the mesa 19. A film of SiN, silicon oxynitride (SiON), or silicon oxide ($SiO_2$) may be disposed on the insulating film 18. The insulating film 18 functions as a reflective film that reflects light emitted from the active layer 14, and the thickness and the refractive index thereof are set so that the reflectance becomes higher. Openings are formed in the insulating film 18, and the electrodes 26 and 28 are disposed therein.

The electrode 26 is an n-type electrode that has a stack structure formed with gold-germanium (AuGe) and nickel (Ni), for example. The electrode 26 is disposed in the groove 13, and is in contact with a surface of the lower reflector layer 12. The electrode 28 is a p-type electrode that has a stack structure formed with titanium (Ti), platinum (Pt), and Au, for example. The electrode 28 is disposed on the mesa 19, and is in contact with a surface of the upper reflector layer 16. The electrodes 26 and 28 are only required to be formed with metals that can be brought into ohmic contact with the lower reflector layer 12 and the upper reflector layer 16, respectively.

Manufacturing Method

Next, a method of manufacturing the surface emitting laser 100 is described. FIG. 2A through FIG. 5B are cross-sectional diagrams showing an example method of manufacturing the surface emitting laser 100. FIG. 6A and FIG. 6B are schematic views of a portion in the vicinity of the groove 11.

Figure 2A:
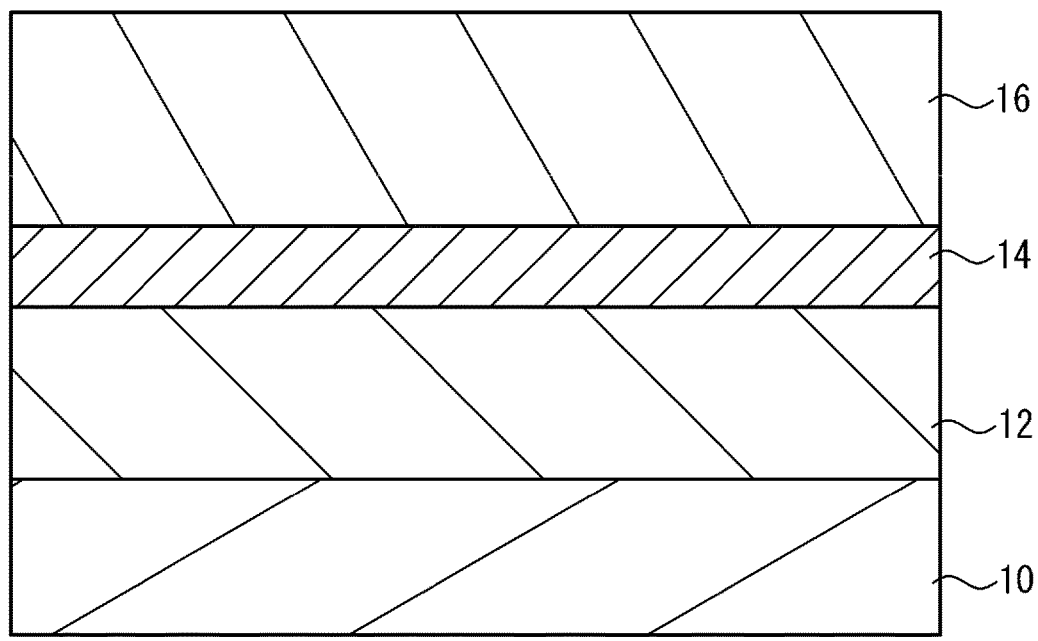
FIGS. 2A and 2B are cross-sectional views showing an example method of manufacturing a surface emitting laser.

As shown in FIG. 2A, the lower reflector layer 12, the active layer 14, and the upper reflector layer 16 are epitaxially grown in this order on the substrate 10 by metal organic chemical vapor deposition (MOCVD), molecular beam epitaxy (MBE), or the like. The lower reflector layer 12 includes an $Al_xGa_{1-x}As$ layer ($0.9 \leq x \leq 1.0$) for forming the current narrowing layer 22. The insulating film 18 is formed on the surfaces of the upper reflector layer 16 by plasma CVD or the like, for example.

Figure 2B:
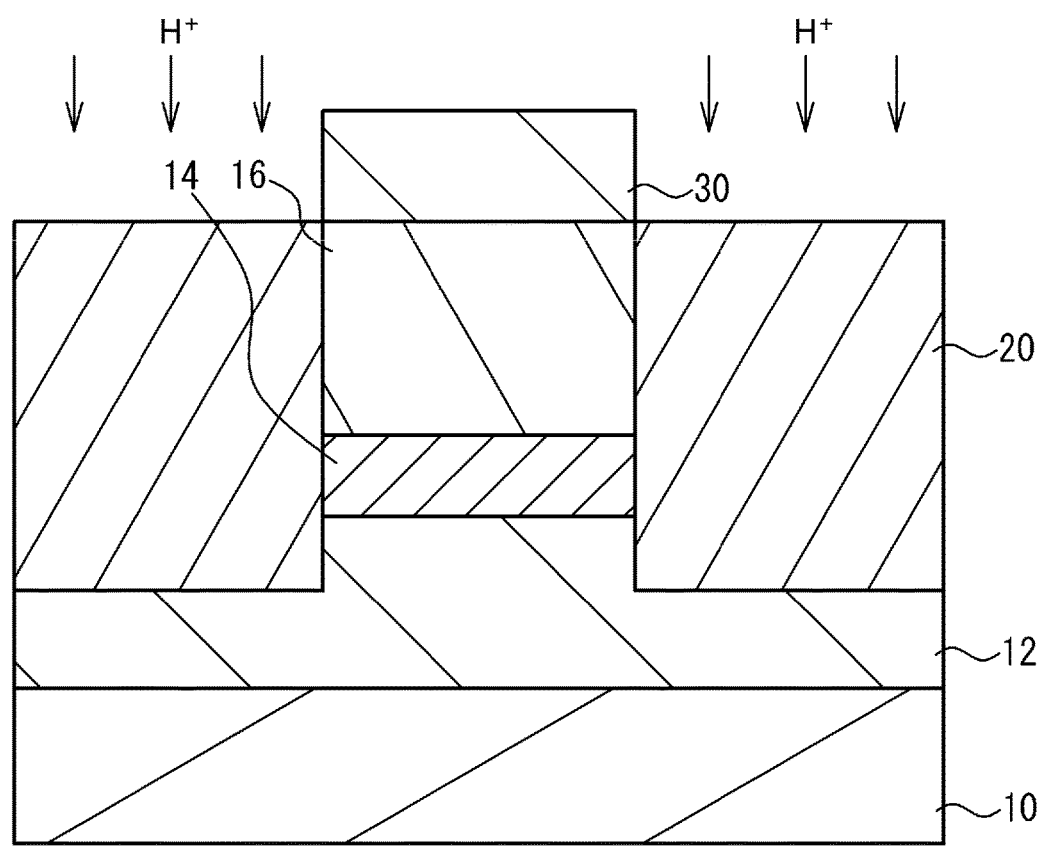

As shown in FIG. 2B, after resist patterning is performed on a photoresist 30, ion injection is performed to form the high-resistance region 20. Specifically, spin coating is performed, to form the photoresist 30 that is not smaller than 10 μm and not greater than 15 μm in thickness, for example. With part of the photoresist 30 being covered with a mask, the photoresist 30 is irradiated with ultraviolet (UV) rays of 365 nm in wavelength by an exposure device. The exposed portion of the photoresist 30 is dissolved with alkaline solution such as tetramethylammonium hydroxide (TMAH), so that the portion covered with the mask in the photoresist 30 remains. Protons (H+) or the like are then injected, for example, to form the high-resistance region 20.

Protons are not injected into the portion covered with the photoresist 30 in the wafer, and protons are injected into the portion exposed through the photoresist 30. The depth of the proton injection is 5 µm, for example, and the high-resistance region 20 is formed in the upper reflector layer 16, the active layer 14, and an upper portion of the lower reflector layer 12. After the ion injection, asking is performed with organic solvent and oxygen plasma or the like, to remove the photoresist 30.

Figure 3A:
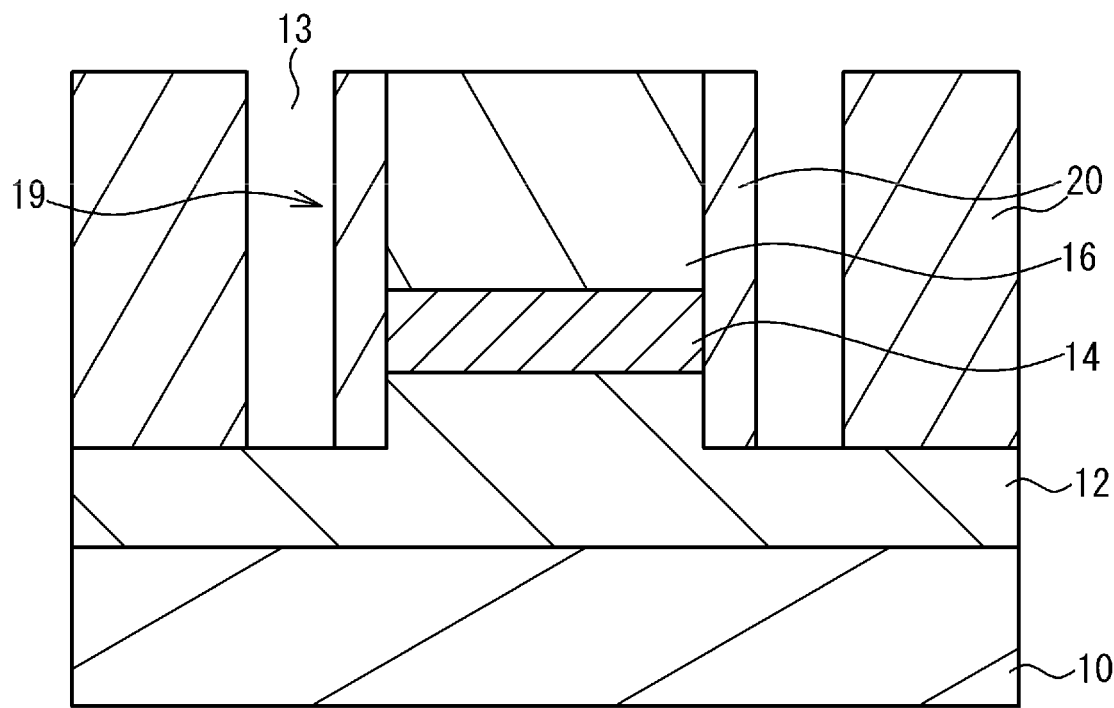
FIGS. 3A and 3B are cross-sectional views showing the example method of manufacturing a surface emitting laser.

As shown in FIG. 3A, dry etching is performed on the high-resistance region 20 with an inductively coupled plasma reactive ion etching (ICP-RIE) device, to form the mesa 19. At this stage, the groove 13 reaching the lower reflector layer 12 is formed in the high-resistance region 20, and the portions not to be subjected to the etching are protected with a photoresist (not shown). The etching gas to be used herein is a $BCl_3$ gas, or a mixture of $BCl_3$ and $Cl_2$, for example. An example of the etching conditions is shown below.

$BCl_3$/Ar=30 sccm/70 sccm (or $BCl_3$/$Cl_2$/Ar=20 sccm/10 sccm/70 sccm)

Figure 3B:
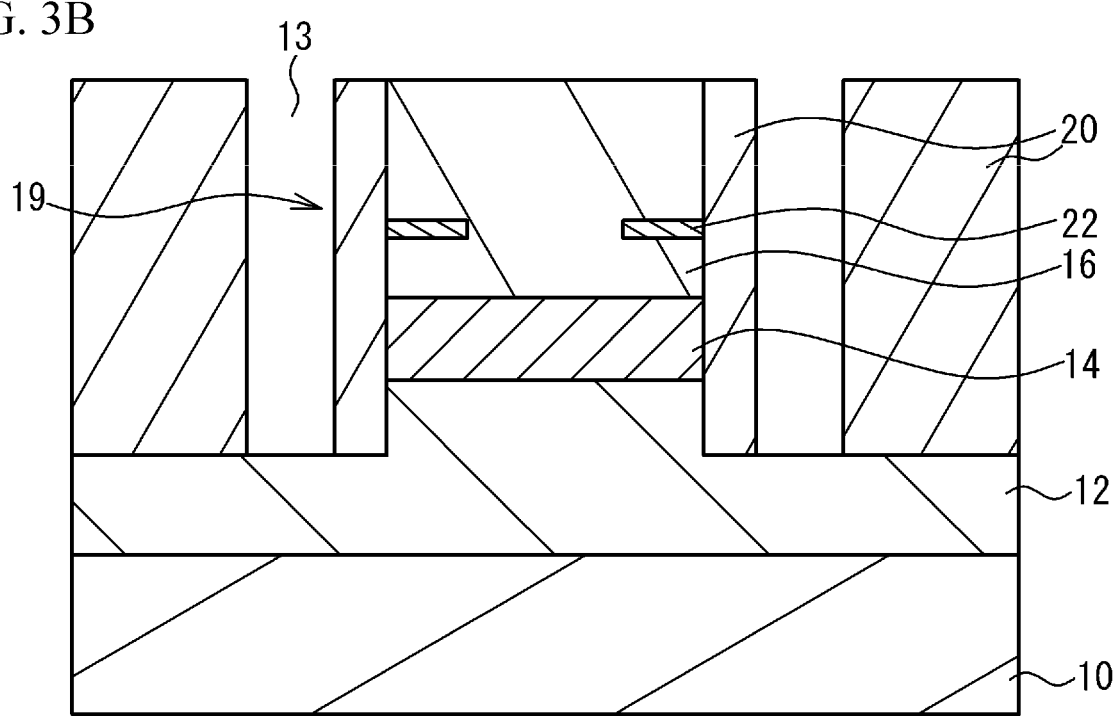

ICP power: 50 to 1000 W
Bias power: 50 to 500 W
Wafer temperature: 25 degrees C. or lower As shown in FIG. 3B, heating to about 400 degrees C. is performed in a water-vapor atmosphere, for example. As a result, part of the upper reflector layer 16 is oxidized from the edge, and thus, the current narrowing layer 22 is formed. The heating duration is set so that the current narrowing layer 22 has a predetermined width, and an unoxidized portion having a predetermined width remains on the inner side of the current narrowing layer 22.

Figure 4A:
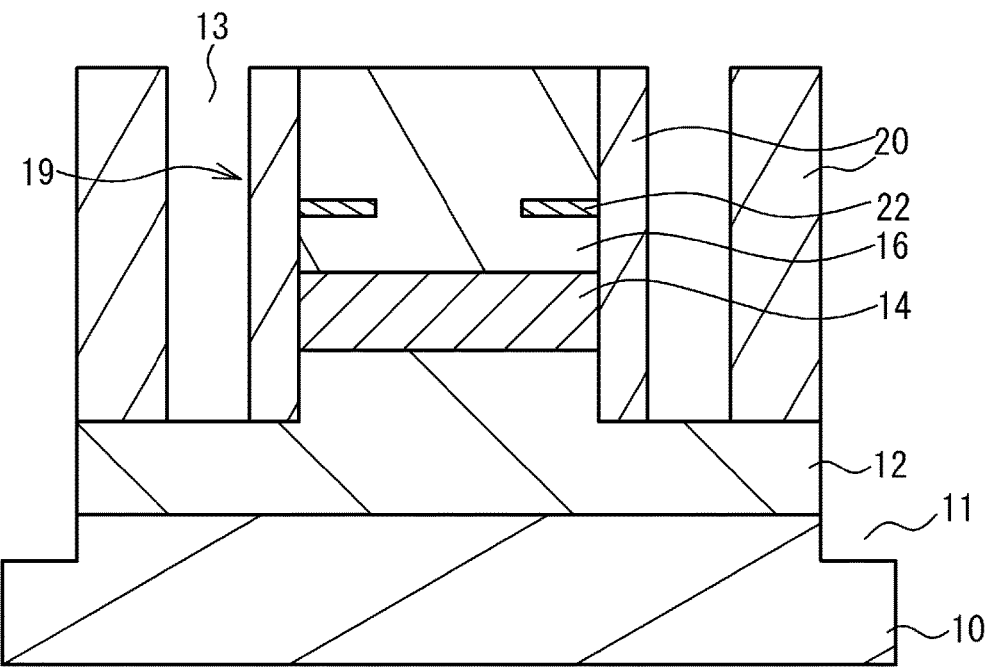
FIGS. 4A and 4B are cross-sectional views showing the example method of manufacturing a surface emitting laser.

As shown in FIG. 4A, dry etching is performed on the high-resistance region 20, the lower reflector layer 12, and part of the substrate 10, to form the groove 11. At this stage, the portions not to be subjected to the etching, such as the mesa 19, and the groove 13, are covered with a photoresist (not shown). The etching gas to be used herein is a $BCl_3$ gas, or a mixture of $BCl_3$ and $Cl_2$, for example. The etching conditions are shown below.

$BCl_3$/Ar=30 sccm/70 sccm (or $BCl_3$/$Cl_2$/Ar=20 sccm/10 sccm/70 sccm)

ICP power: 50 to 1000 W
Bias power: 50 to 500 W
Wafer temperature: 25 degrees C. or lower The groove 11 has a depth of 7 µm, for example, and penetrates through the high-resistance region 20 and the lower reflector layer 12. With the groove 11, surface emitting lasers 100 are electrically separated from one another. The surface of the substrate 10 exposed by the etching serves as the bottom surface of the groove 11.

There is a possibility that, after the wafer is taken out of the device for etching such as ICP-RIE, the Cl remaining on the surface of the substrate 10 will react with moisture in the air and generate hydrogen chloride, and the semiconductors will be corroded by the hydrogen chloride. Therefore, after the etching, cleaning with pure water or the like is performed, to remove the Cl. As shown in FIG. 6A, Ga and As are oxidized at this stage, to form an oxide $Ga_2O_3$ indicated by white circles and an oxide $As_2O_3$ indicated by black circles on the bottom surface of the groove 11.

Figure 4B:
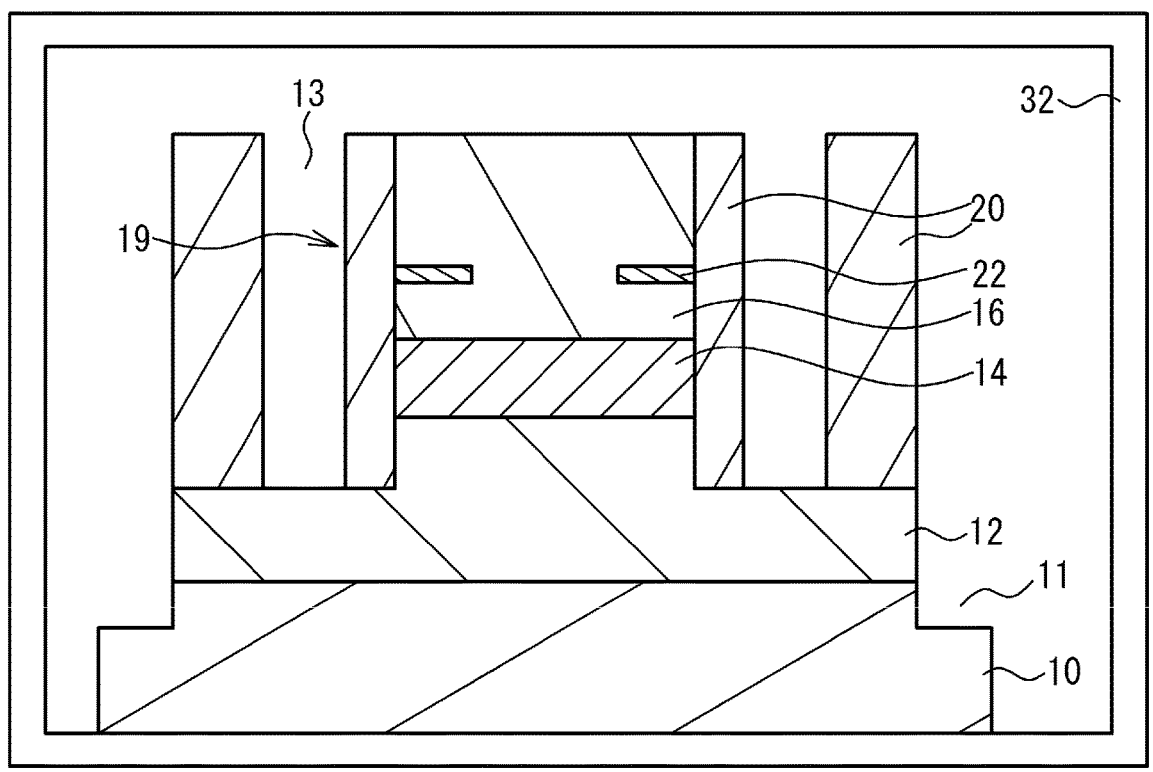

As shown in FIG. 4B, the cleaned wafer is put into a chamber 32, and is subjected to heat treatment (a first heat treatment step). The chamber 32 is a chamber of a CVD device or the like, for example, and temperature and pressure are set without any material input prior to the heat treatment. An example of the conditions for the heat treatment is shown below.
Temperature: not lower than 250 degrees C., and not higher than 350 degrees C.
Duration: not shorter than 30 minutes, and not longer than 60 minutes
Pressure: not lower than 1 Pa, and not higher than 100 Pa
Atmosphere: nitrogen ($N_2$) or argon (Ar)

The oxide $As_2O_3$ can be removed from the wafer surface by the heat treatment. Since the melting points of GaAs and $Ga_2O_3$ are 1000 degrees C. or higher, the influence of the heat treatment thereon is small. Meanwhile, the melting point of $As_2O_3$ is 312.2 degrees C., which is lower than that of $Ga_2O_3$. Therefore, the melting point of $As_2O_3$ causes a state change such as dissolution and sublimation, and the $As_2O_3$ is detached from the surface of the substrate 10 as shown in FIG. 6B. Heat treatment is conducted in a reduced-pressure atmosphere at 1 to 100 Pa, to accelerate the detachment of $As_2O_3$. To prevent damage to the current narrowing layer 22, which is an oxide layer, the upper limit of the heat treatment temperature is set at 350 degrees C., for example. Since the melting point of $Ga_2O_3$ is about 1000 degrees C., $Ga_2O_3$ is not easily detached.

Figure 5A:
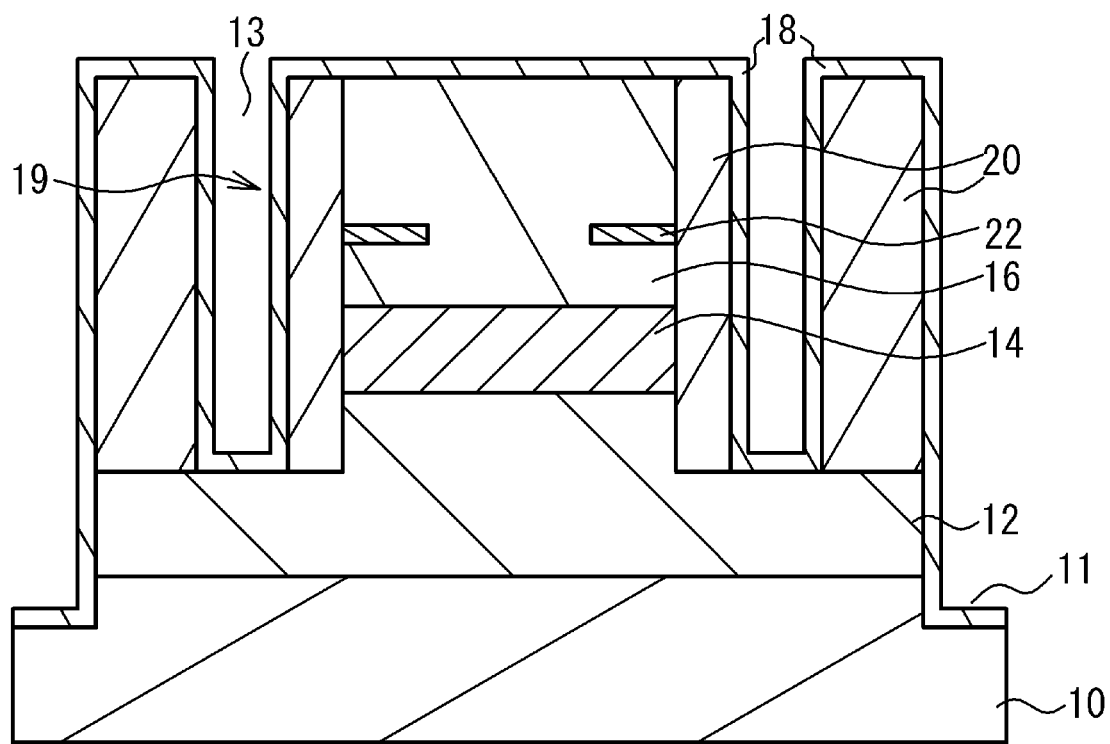
FIGS. 5A and 5B are cross-sectional views showing the example method of manufacturing a surface emitting laser.
Figure 6A:
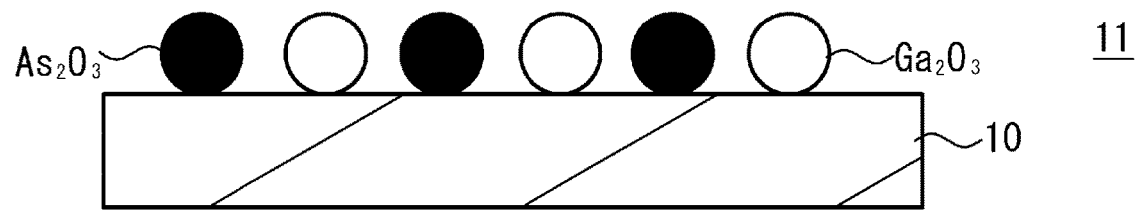
FIGS. 6A and 6B are schematic views of a portion in the vicinity of a groove.
Figure 6B:
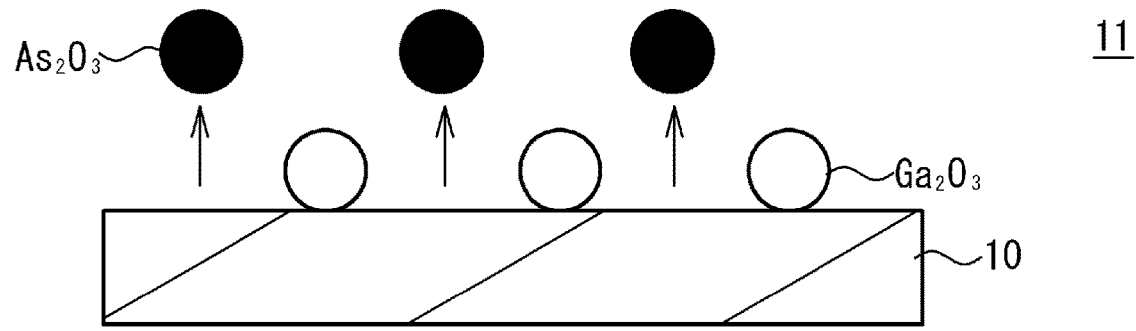

As shown in FIG. 5A, the insulating film 18 covering the wafer is formed by plasma CVD or the like, for example. Since the $As_2O_3$ has been detached by the heat treatment, the $As_2O_3$ is unlikely to be contained in the interface between the substrate 10 and the insulating film 18.

Figure 5B:
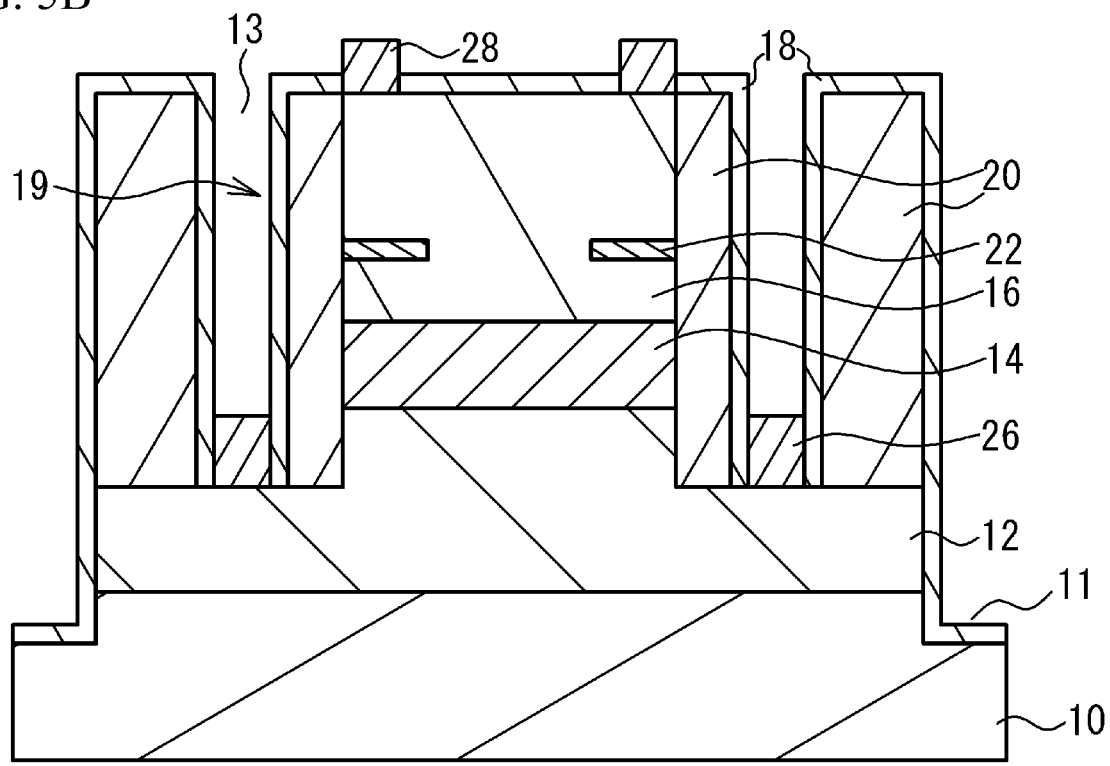

As shown in FIG. 5B, openings are formed in part of the insulating film 18. Resist patterning and vacuum vapor deposition are then performed, so that the electrode 26 is formed on a surface of the lower reflector layer 12, and the electrode 28 is formed on a surface of the upper reflector layer 16. After the formation of the electrodes, heat treatment at a temperature of about 400 degrees C. is conducted, for example, to cause ohmic contact between the electrodes and the semiconductors (a second heat treatment step). Wiring lines or the like connecting to the electrodes 26 and 28 may also be formed by plating processing or the like.

The back surface of the substrate 10 is polished with a back grinder, a lapping device, or the like, to reduce the wafer thickness to about 100 to 200 µm. The wafer is then diced with a dicer, so that chip-like surface emitting lasers 100 are formed.

Comparative Example

In a comparative example, the same steps as those in the first embodiment are carried out until the formation of the groove 11, and the step shown in FIG. 5A and the later steps are carried out without the heat treatment shown in FIG. 4B. According to the comparative example, the insulating film 18 peels off in the groove 11. Meanwhile, peeling is unlikely to occur in a surface of the high-resistance region 20 and the groove 13. To investigate the cause of the peeling, the sample manufactured in the comparative example was subjected to X-ray photoelectron spectroscopy (XPS) analysis. The materials of the sample and the like are the same as those in the first embodiment, and the heat treatment in FIG. 4B was not carried out.

Figure 7:
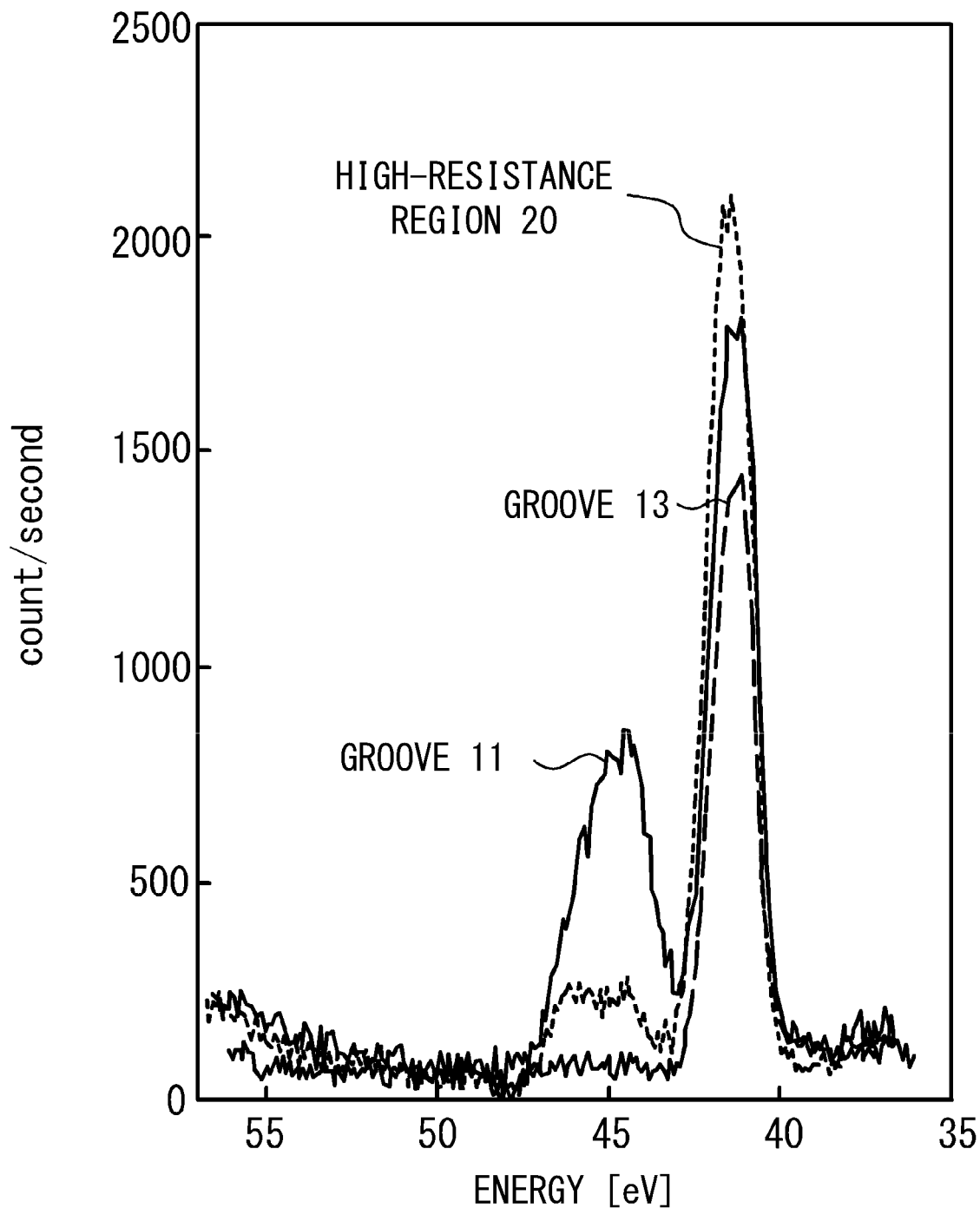
FIG. 7 is a graph showing results of XPS analysis.

FIG. 7 is a graph showing the results of the XPS analysis. The abscissa axis indicates energy, and the ordinate axis indicates strength (count/second). A dotted line indicates the result of the analysis of the surface of the high-resistance region 20, a dashed line indicates the result of the analysis of the bottom surface of the groove 13, and a solid line indicates the result of the analysis of the bottom surface of the groove 11. In FIG. 7, $As_2O_3$ is at around 45 eV, and GaAs is at around 42 eV. GaAs was detected at any portion. The strength of $As_2O_3$ becomes higher in the order of the bottom surface of the groove 13, the high-resistance region 20, and the bottom surface of the groove 11.

In view of this, $As_2O_3$ is considered as the cause of the peeling in the groove 11. Dry etching is performed on compound semiconductors such as AlGaAs and GaAs with a Cl-based gas such as a $BCl_3$ gas, to form the groove 11. After the etching, cleaning is performed to remove the Cl components. At this stage, oxides of Ga and As are formed, and the oxide $As_2O_3$ is detected in the groove 11 as indicated by the solid line in FIG. 7. Heated to about 400 degrees C. in the heat treatment or the like at the time of the ohmic contact formation, the $As_2O_3$ undergoes a state change such as dissolution and sublimation, and expands. Because of this, the insulating film 18 is pushed up, and then peels off.

Meanwhile, the surface of the high-resistance region 20 is not subjected to etching, and accordingly, an oxide as a result of cleaning is unlikely to be generated. Further, since the groove 13 is formed by etching, an oxide is formed as a result of cleaning. However, as shown in FIG. 3B, after the formation of the groove 13, heating to about 400 degrees C. is performed, to form the current narrowing layer 22. At this stage, the $As_2O_3$ having a melting point at 400 degrees C. or lower is detached. Therefore, the dashed line and the dotted line in FIG. 7 indicate lower strengths for $As_2O_3$ than the solid line, and peeling of the insulating film 18 is more unlikely to occur than in the groove 11. As described above, the large amount of oxide $As_2O_3$ remaining in the groove 11 is considered as the cause of the peeling.

According to the first embodiment, the groove 11 reaching the substrate 10 is formed by dry etching, and cleaning is performed, followed by heat treatment, as shown in FIG. 4A and FIG. 4B. Due to the heat treatment, the oxide $As_2O_3$ is detached from the surface of the substrate 10. After that, the insulating film 18 is formed, and the heat treatment for forming the ohmic contacts of the electrodes 26 and 28 is performed. Because of the heat treatment, the oxide $As_2O_3$ is removed, and is unlikely to remain under the insulating film 18. Thus, peeling of the insulating film 18 due to a state change of the $As_2O_3$ during the heat treatment after the electrode formation is prevented.

The heat treatment temperature is lower than the temperature during the formation of the current narrowing layer 22. Accordingly, damage to the current narrowing layer 22 during the heat treatment is prevented. For example, the current narrowing layer 22 is preferably formed at about 400 degrees C., and the temperature during the heat treatment is preferably not lower than 250 degrees C. and not higher than 350 degrees C. For example, heating to 350 degrees C. causes pealing of 74% of As. However, the melting point of $Ga_2O_3$ is as high as about 1000 degrees C. Because of this, $Ga_2O_3$ is unlikely to undergo a state change during the heat treatment after the electrode formation, and is also unlikely to become the cause of peeling. In view of this, $Ga_2O_3$ may remain as shown in FIG. 6B. Further, there is no need to perform heating to around the melting point of $Ga_2O_3$ during the heat treatment after the formation of the groove 11.

The heat treatment shown in FIG. 4B is preferably conducted in a reduced-pressure atmosphere at about 1 to 100 Pa, for example. $As_2O_3$ can be removed more effectively than at atmospheric pressure. Further, heat treatment may be performed under an inert gas atmosphere such as $N_2$ or Ar, to reduce the influence on the current narrowing layer 22. To remove the oxide in a satisfactory manner, the duration of the heat treatment is not shorter than 30 minutes and not longer than one hour.

The mesa 19 and the current narrowing layer 22 are preferably formed in a continuous manner, and it is preferable not to carry out any other step such as heat treatment in between. For example, if the mesa 19 is exposed to the atmosphere or is heated, it is difficult to form the $Al_2O_3$ to be the current narrowing layer 22 as intended. Therefore, it is preferable to form the mesa 19 and the current narrowing layer 22 in a continuous manner, and then perform heat treatment.

As the current narrowing layer 22 is formed after the formation of the groove 11, the $As_2O_3$ can be removed from the etching surface by the heat generated during the formation of the current narrowing layer 22. However, since the groove 11 has a depth of 7 μm, for example, the precision of the resist patterning for forming the mesa 19 might become lower, resulting in size variation. Therefore, it is preferable to perform heat treatment after the formation of the mesa 19 and the formation of the current narrowing layer 22.

The substrate 10, the lower reflector layer 12, the active layer 14, and the upper reflector layer 16 may be formed with compound semiconductors other than the above described ones. For example, the substrate 10 is a compound semiconductor substrate containing Ga and As, such as GaAs or AlGaAs.

What is claimed is:

1. A method of manufacturing a surface emitting laser, the method comprising:
   a step of preparing a substrate containing gallium and arsenic, a lower reflector layer, an active layer, and an upper reflector layer being formed sequentially in the substrate, the lower reflector layer including a semiconductor multilayer film, the upper reflector layer including a semiconductor multilayer film;
   a step of forming a mesa by performing etching on the lower reflector layer, the active layer, and the upper reflector layer;
   a step of forming a current narrowing layer by oxidizing a part of the upper reflector layer, after the step of forming the mesa;
   a step of exposing the substrate by performing etching on the lower reflector layer, the active layer, and the upper reflector layer, using a chlorine-containing gas;
   a step of cleaning the substrate, after the step of exposing the substrate;
   a first heat treatment step of performing heat treatment on the substrate, after the step of cleaning;
   a step of forming an insulating film covering a surface of the substrate exposed by the etching, after the first heat treatment step;
   a step of forming an electrode on the lower reflector layer and the upper reflector layer; and
   a second heat treatment step of performing heat treatment on the substrate after the formation of the electrode,
   wherein a temperature in the first heat treatment step is lower than a temperature in the step of forming the current narrowing layer.

2. The method according to claim 1, wherein the temperature in the first heat treatment step is not lower than 250 degrees C. and not higher than 350 degrees C.

3. The method according to claim 1, wherein the substrate is disposed in a reduced-pressure atmosphere in the first heat treatment step.

4. The method according to claim 1, wherein the first heat treatment step is continued for not shorter than 30 minutes and not longer than one hour.

* * * * *